US011857855B2

(12) United States Patent
Rosenkranz et al.

(10) Patent No.: US 11,857,855 B2
(45) Date of Patent: Jan. 2, 2024

(54) CHARACTERIZATION OF A BALL GAME RACKET FRAME

(71) Applicant: Head Technology GmbH, Kennelbach (AT)

(72) Inventors: Harald Rosenkranz, Lauterach (AT); Nathan Elliott, Wolfurt (AT); Stefan Mohr, Dornbirn (AT); Ralf Schwenger, Weiler-Simmerberg (DE)

(73) Assignee: Head Technology GmbH, Kennelbach (AT)

( * ) Notice: Subject to any disclaimer, the term of this patent is extended or adjusted under 35 U.S.C. 154(b) by 0 days.

(21) Appl. No.: 17/377,689

(22) Filed: Jul. 16, 2021

(65) Prior Publication Data

US 2022/0016503 A1 Jan. 20, 2022

(30) Foreign Application Priority Data

Jul. 17, 2020 (DE) ..................... 10 2020 004 307.0

(51) Int. Cl.
*A63B 60/42* (2015.01)
*G06F 30/10* (2020.01)
(52) U.S. Cl.
CPC .............. *A63B 60/42* (2015.10); *G06F 30/10* (2020.01)

(58) Field of Classification Search
CPC ............ A63B 60/42; A63B 2049/0201; A63B 2102/06; A63B 2102/02; A63B 49/02; G06F 30/10
See application file for complete search history.

(56) References Cited

U.S. PATENT DOCUMENTS

2012/0214625 A1* 8/2012 Brandt ................... A63B 60/42
473/543
2013/0095962 A1* 4/2013 Yamamoto ............. A63B 49/00
473/464

FOREIGN PATENT DOCUMENTS

CA 2248844 A1 * 4/1999 ............. A63B 49/02

OTHER PUBLICATIONS

Nasruddin et al. "Finite Element Analysis on Badminton Racket Designs", 2016 (Year: 2016).*
Allen et al. "A review of tennis racket performance parameters", 2015 (Year: 2015).*
H. Brody, Medicine and Science in Tennis, vol. 8, No. 1, Apr. 2003.

* cited by examiner

*Primary Examiner* — Rehana Perveen
*Assistant Examiner* — Troy A Maust
(74) *Attorney, Agent, or Firm* — Bookoff McAndrews, PLLC

(57) ABSTRACT

The present invention relates to a method for characterizing a racket head of a ball game racket frame as well as to the representation of a racket head.

20 Claims, 22 Drawing Sheets

CHARACTERIZATION OF A BALL GAME RACKET FRAME

This patent application claims the benefit under 35 U.S.C. 119 to German Patent Application No. 10 2020 004 307.0, filed on Jul. 17, 2020, the entirety of which is incorporated herein by reference.

The present invention relates to a method for characterizing a racket head of a ball game racket frame as well as to the representation of a racket head.

It has long been known that, i.a., the shape of the racket head of a ball game racket has a decisive influence on the playing characteristics of such a ball game racket. On the one hand, the shape of the racket head defines the respective length of the main and cross strings. On the other hand, the shape of the racket head also has an influence on how strongly or in what way the racket head is deformed when the strings are hit by a ball. Therefore, a variety of racket head shapes are known (and also offered on the market), which, however, are only inadequately described by terms such as "classic oval" or "teardrop shape".

It is therefore an object of the present invention to provide a method for characterizing a racket head that allows the classification of different racket head shapes using an objective, quantifiable parameter.

This object is achieved with a method according to claim 1. Preferred embodiments of the method according to the invention are described in the dependent claims.

Accordingly, the present invention is directed to a method for characterizing a racket head of a ball game racket frame. Firstly, data of a ball game racket frame that describe the contour of the racket head of the ball game racket frame are provided in order to carry out the method. On the basis of these contour data, one or more of the following parameters characterizing the racket head shape are then automatically determined: measure of the length-width asymmetry of the racket head, measure of the deviation of the racket head shape from a circular shape, evolute of the racket head contour. The parameter or the parameters determined in this way are then output and/or graphically represented.

In other words, the present invention allows one or more precisely defined, geometrically determined parameters to be identified for the racket head shape of a particular ball game racket frame, by means of which the characterized racket head can be objectively classified and quantitatively compared to other racket heads.

The method according to the invention can be used for any ball game racket frame, but is particularly preferably suitable for characterizing a racket head of a tennis or squash racket.

As a parameter intended to characterize the racket head shape, i.a., a measure of the length-width asymmetry of the racket head can be considered. According to a first preferred embodiment of the method according to the invention, this measure can be determined by identifying the longitudinal diagonal through the racket head contour having the greatest length (that is usually the central or longitudinal axis). Further, the transverse diagonal through the racket head contour having the greatest width is identified, wherein the transverse diagonal is oriented perpendicular to the longitudinal diagonal, i.e., perpendicular to the longitudinal axis of the ball game racket frame. On the basis thereof, the point of intersection of the longitudinal diagonal with the transverse diagonal is established, and the offset between the established point of intersection and the midpoint of the longitudinal diagonal (that is, the point on the longitudinal diagonal that divides it into two equal halves) is identified.

In the case of a racket head usually referred to as "classic oval", this offset is very small, whereas in the case of a so-called "teardrop shape", this offset is relatively large.

An alternative or additional measure of the length-width asymmetry of the racket head can be determined by identifying the longitudinal diagonal through the racket head contour having the greatest length, identifying the transverse diagonal through the racket head contour having the greatest width, and determining the ratio between the length of the longitudinal diagonal and the length of the transverse diagonal. While the above discussed length-width asymmetry measure quantifies the deviation of the racket head shape from an ellipse, the latter length-width asymmetry measure describes the deviation from an isotropic shape (such as a circle or a square). Therefore, it is particularly preferred to determine both parameters, since in combination they characterize the racket head shape better than one of these parameters alone.

According to a further preferred embodiment of the method according to the invention, a parameter characterizing the racket head shape is a measure of the deviation of the racket head shape from a circular shape, which can be determined by identifying the longitudinal diagonal through the racket head contour having the greatest length, identifying the transverse diagonal through the racket head contour having the greatest width, establishing the point of intersection of the longitudinal diagonal with the transverse diagonal, and defining a circle around the established point of intersection having a diameter smaller than the length of the transverse diagonal. In this preferred embodiment of the method according to the invention, it is particularly useful to graphically represent the determined parameter, preferably in combination with a representation of the racket head contour or the entire racket head. In such a combined representation, the deviation of the racket head contour from the circular shape can be ideally visualized for the entire racket head, since any variable distance between the racket head contour and the circle can be seen much better than the corresponding variation of the radius of the entire racket head contour.

Basically, a circle of any diameter can be selected as long as it is smaller than the length of the transverse diagonal. However, it is preferred that the diameter of the circle is approximately as large as the length of the transverse diagonal, since thus the variation in the distance between the racket head contour and the circle becomes particularly large. Preferably, the diameter of the circle is at least 70%, more preferably at least 80% and particularly preferably at least 90% of the length of the transverse diagonal.

Where appropriate, the midpoint of the longitudinal diagonal additionally can also be graphically displayed in order to additionally clarify the offset discussed above.

In order to further quantify the measure of the deviation of the racket head shape from a circular shape, a plurality of racket head contour segments can be defined, each extending from the circle to the racket head contour and bounded by an arc of the circle, a portion of the racket head contour and two sides extending in a radial direction with respect to the point of intersection, wherein the angle between the two sides of a racket head contour segment is the same for all racket head contour segments. The size of these racket head contour segments can then be quantified by establishing the length of the sides of the racket head contour segments and/or the area of the racket head contour segments. The corresponding values can be output as determined parameters and/or graphically represented, for example as a curve showing the racket head contour segment area as a function of the angle that the racket head contour segment defines with the longitudinal axis.

In principle, the number of the racket head contour segments used is arbitrary. However, the more segments are used, the greater is the information content. It is therefore preferred to use at least six, more preferably at least eight, even more preferably at least ten and particularly preferably at least twelve segments for one racket head half (of a symmetrical ball game racket frame).

In the graphical representation of the defined circle discussed above, the racket head contour segments can preferably also be graphically represented.

It is further preferred to classify the racket head contour segments on the basis of the determined length and/or area and to graphically visualize this classification in the representation, preferably by assigning one or more of the following graphical parameters to predetermined classes of the classification: color value, tonal value, hatching. If, for example, the individual racket head contour segments are colored with different colors according to their area, not only the qualitative course of the deviation of the racket head contour from a circular shape can be clearly seen and understood (as is possible by drawing in the circle), but also quantified information can be easily read. In particular, a quantified comparison with similar but different racket head shapes is then possible in a simple manner.

According to a further preferred embodiment of the method according to the invention, the evolute of the racket head contour is automatically determined as a parameter characterizing the racket head shape. For this purpose, the normal vectors to a plurality of points along the racket head contour are identified, wherein the end point of each normal vector corresponds to the center of the associated circle of curvature at this point of the racket head contour.

Optionally connected to form a curve, the end points of these normal vectors can be graphically visualized, wherein this is particularly preferably done in combination with a graphical representation of the racket head contour. Alternatively, the length of each of the normal vectors as a function of the angle (relative to the longitudinal axis) can also be output in the form of numerical values or as a curve.

The number of points used to determine the evolute is basically arbitrary, but with increasing number the result becomes more informative. It is therefore preferred to use at least 10, preferably at least 15, more preferably at least 20, and particularly preferably at least 25 points for a racket head half (of a symmetrical racket head) to establish the evolute. Ideally, the evolute is established (quasi-)continuously along the racket head contour.

The ball game racket frame data can be present in any form and can comprise, for example, CAD data of the contour, preferably the inner contour, of the racket head.

According to the invention, the data can alternatively also be generated if an actual racket head is present. To this end, a (photographic) image of the racket head of a ball game racket frame with a viewing axis perpendicular to the string bed plane is created and the contour, preferably the inner contour, of the racket head is automatically determined from the image. For this purpose, the image of the racket head can be converted into a binary pixel image, wherein the threshold value is selected such that a first value is assigned to each of the pixels of the frame and a second value is assigned to each of all other pixels. Subsequently, the frame pixels can be identified and connected to form a racket head contour.

According to the invention, the parameter or parameters characterizing the racket head shape can also be used to automatically determine the playing characteristics of the ball game racket frame. By means of one parameter or in particular a combination of a plurality of parameters, for example, ball game racket frames can be classified with indications such as "much power", "little power", "much control", "little control", etc. Such an automatic classification is possible, for example, by using an artificial intelligence, for example a neural network, which has been trained beforehand with empirical values of a plurality of players.

Furthermore, according to the invention, at least one alternative racket head can be automatically determined which approximates the playing characteristics of the characterized racket head with regard to the determined parameter or parameters. For this purpose, the determined parameter or parameters can be compared, for example, with corresponding parameters of a racket library and those rackets can be identified whose racket head shape is as similar as possible with respect to the determined parameter or parameters.

It is further preferred to carry out the method according to the invention for two or more ball game racket frames and to compare the determined parameters and optionally the playing characteristics of these ball game racket frames.

The present invention is further directed to a representation of a racket head of a ball game racket frame comprising a graphical representation of the racket head of the ball game racket frame, optionally comprising a representation of at least a portion of the string bed, and one or more of the following parameters characterizing the racket head shape: measure of the length-width asymmetry of the racket head, measure of the deviation of the racket head shape from a circular shape, evolute of the racket head contour. Preferably, the representation further comprises a graphical representation of the racket head contour segments, preferably with graphical visualization of a classification of the racket head contour segments according to the determined length and/or area, preferably by assigning one or more of the following graphical parameters to predetermined classes of the classification: color value, tonal value, hatching.

The present invention is further directed to a set comprising a ball game racket frame and a representation of the racket head of said ball game racket frame as described above. If such a set is offered for sale, the customer or player can quantitatively evaluate the racket head shape in a simple manner, compare it with other racket head shapes also offered and/or put it in relation to a racket head shape known to him/her and with which he/she has made good experience during play.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the following, preferred embodiments of the present invention are explained in more detail with reference to the Figures, in which.

DETAILED DESCRIPTION

Figure 1:
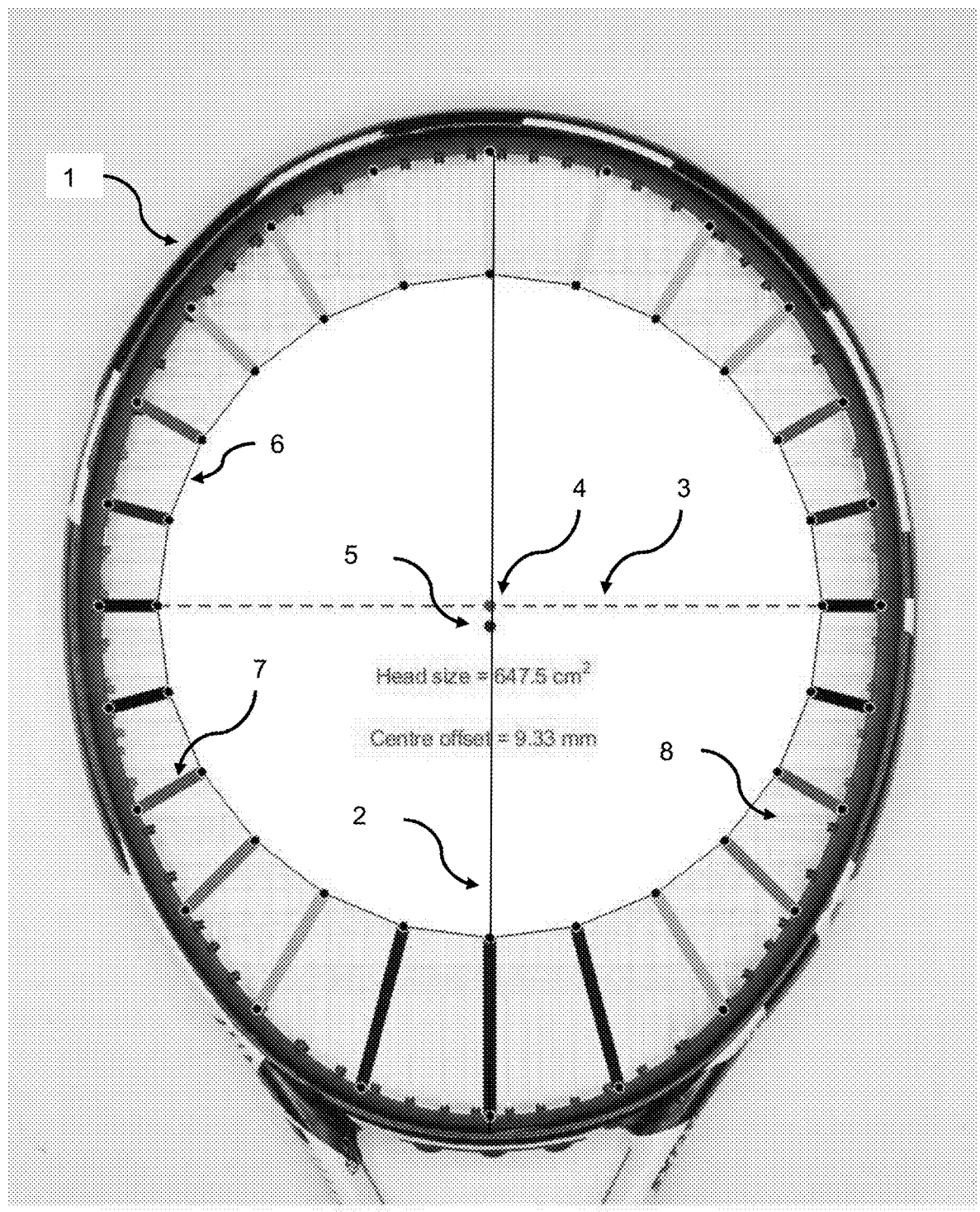
FIG. 1 shows a top view of a tennis racket head comprising various parameters according to the invention for characterizing the racket head shape.
Figure 2A:
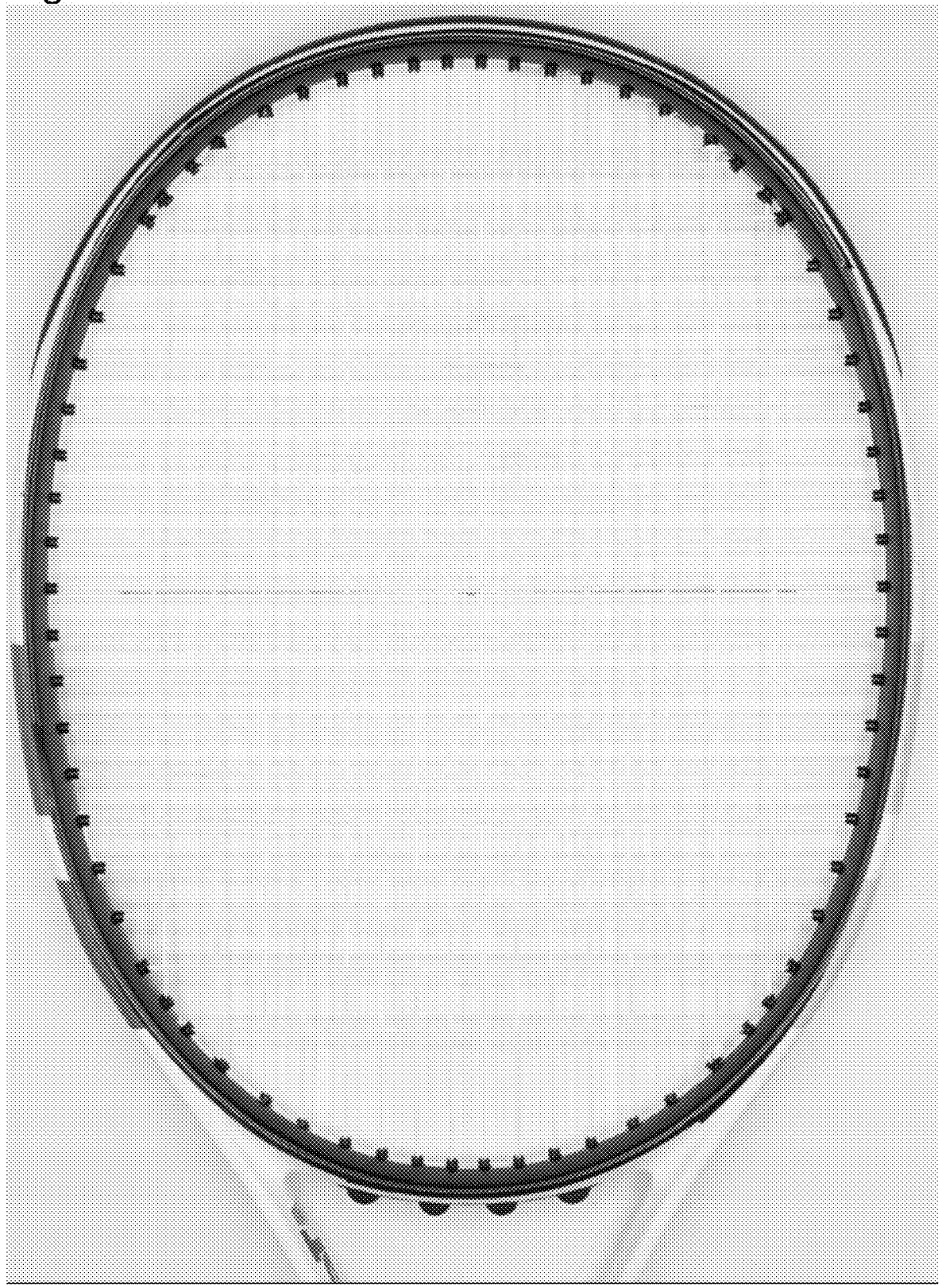
FIG. 2A shows a top view of the tennis racket "Babolat Pure Strike 16×19"
Figure 2B:
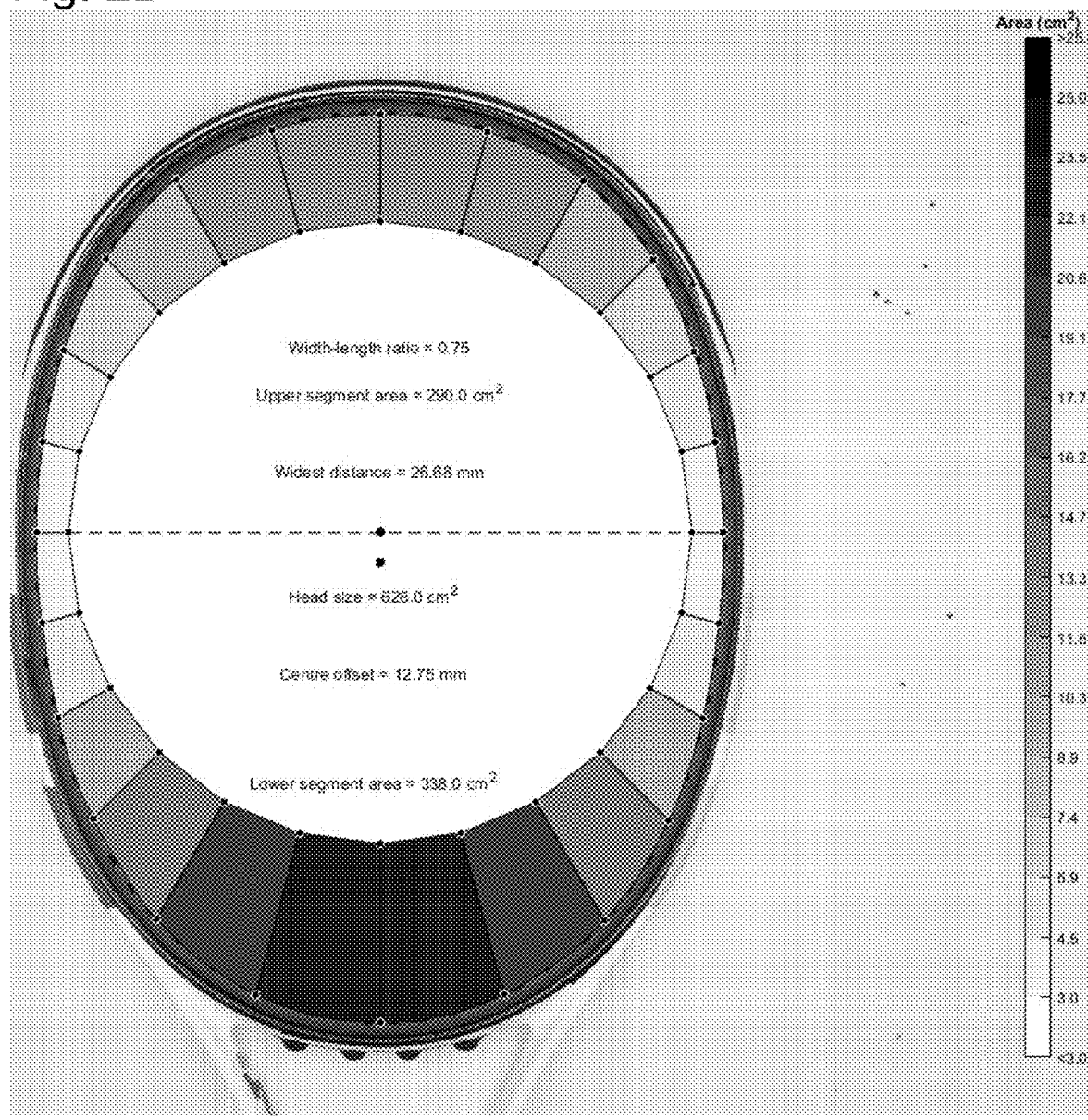
FIG. 2B shows a top view according to FIG. 2A including the racket head contour segments according to the invention.

FIG. 1 shows a top view of the racket head 1 of a tennis racket. The longitudinal diagonal 2 through the racket head contour with the greatest length and the transverse diagonal 3 through the racket head contour with the greatest width are also shown in the image of the racket head 1. The longitudinal diagonal 2 and the transverse diagonal 3 intersect at the point of intersection 4. Furthermore, the midpoint 5 of the longitudinal diagonal 2 is identified. The offset between the point of intersection 4 and the midpoint 5 of the longitudinal diagonal 2 ("center offset") was determined to be 9.33 mm in the example shown.

Furthermore, in FIG. 1 a circle 6 having a diameter smaller than the length of the transverse diagonal 3 is depicted around the established point of intersection 4. As is readily apparent from FIG. 1, this graphically visualized circle 6 clearly illustrates the deviation of the racket head shape from a circular shape.

In order to better quantify this deviation, a plurality of racket head contour segments 8 can be defined according to the invention, each of which extends from the circle 6 to the racket head contour and is bounded by an arc of the circle, a portion of the racket head contour and two sides 7 extending in a radial direction with respect to the point of intersection 4, wherein the angle between the two sides 7 of a racket head contour segment 8 is the same for all racket head contour segments. In the example according to FIG. 1, this angle is 15°. If the length of the sides 7 is now established for each racket head contour segment 8, this length is a quantitative measure of the deviation of the racket head shape from a circular shape.

According to the invention, the individual racket head contour segments 8 can be classified on the basis of the determined length of the sides 7. This classification can then also be graphically visualized, for example by coloring the sides 7 of the racket head contour segments 8. This coloring was carried out in the example of FIG. 1, but can only be seen to some extent due to the black-and-white representation. It should be clear, however, that coloring using an appropriately selected color spectrum can clearly visualize for the viewer the measure of the deviation of the racket head shape from a circular shape as discussed here.

Instead of the length of the sides 7 of the racket head contour segments 8, their area can also be determined. The racket head contour segments 8 can then be classified and colored according to the determined area, for example.

In FIGS. 2B to 10B, corresponding classifications for the racket head shapes according to FIGS. 2A to 10A are visualized by means of different shades of gray, each indicating the area of the racket head contour segments. The scaling can be seen on the right side of each of FIGS. 2B to 10B, according to which the shades of gray from white to black classify the following area ranges (each measured in $cm^2$): <3.0-3.0; 3.0-4.5; 4.5-5.9; 5.9-7.4; 7.4-8.9; 8.9-10.3; 10.3-11.8; 11.8-13.3; 13.3-14.7; 14.7-16.2; 16.2-17.7; 17.7-19.1; 19.1-20.6; 20.6-22.1; 22.1-23.5; 23.5-25.0; 25.0->25.0.

As revealed by a comparison of FIGS. 2A to 10A, the individual racket head shapes are in some cases visually hard to distinguish from one another. In fact, however, the differences with respect to the parameters according to the invention are considerable, as is apparent from FIGS. 2B to 10B. Since these differences also have a corresponding influence on the playing characteristics of the corresponding ball game racket, the objective and quantifiable characterization made possible according to the invention on the basis of the parameters according to the invention is of high value for the player.

From the point of view of maximum error forgiveness, each player will try to hit the ball wherever possible at the point of maximum racket width. However, as Brody points out (cf. H. Brody, Medicine and Science in Tennis, vol. 8, no. 1, April 2003), the point of "maximum ball acceleration" varies depending on the kinematics of the swing or stroke as well as depending on the relationship between the velocities of the incoming ball and the struck ball. For example, a volley, in which there is a strong translational movement of the racket and virtually no rotational component and in which the speed of the ball is significantly higher than the speed of the racket, should ideally be hit rather in the lower area of the hitting surface in order to achieve both good acceleration and low rotation around the center of gravity due to the contact with the ball. In contrast, a forehand topspin stroke performed in a modern manner, in which strong acceleration is achieved primarily through the use of the wrist as the last link in the kinematic chain and the stroke movement therefore contains a strong rotational component, should be hit wherever possible in the upper area to achieve maximum ball acceleration.

Figure 3A:
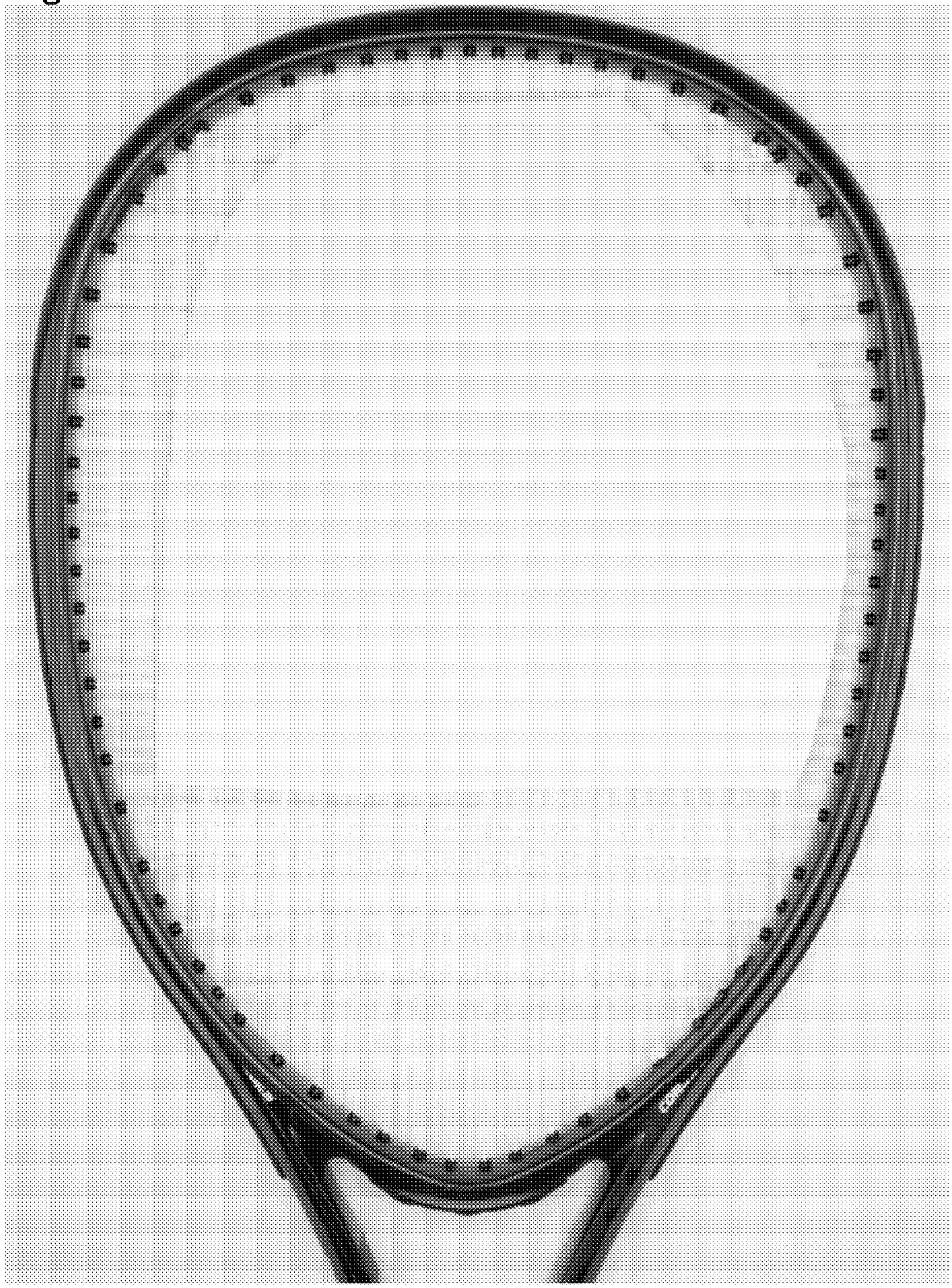
FIG. 3A shows a top view of the tennis racket "HEAD Pyramid Tour 630"
Figure 3B:
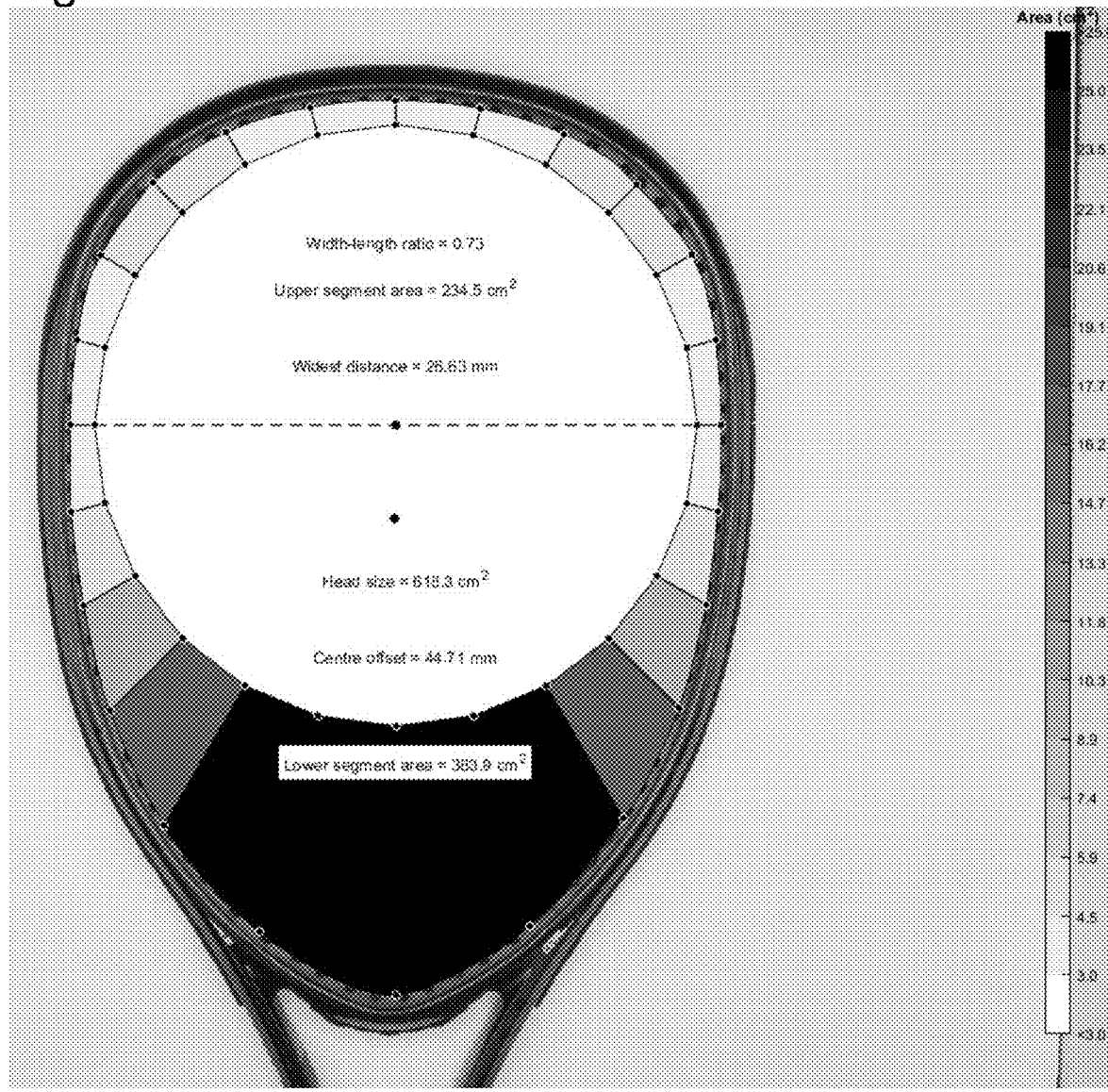
FIG. 3B shows a top view according to FIG. 3A including the racket head contour segments according to the invention.
Figure 4A:
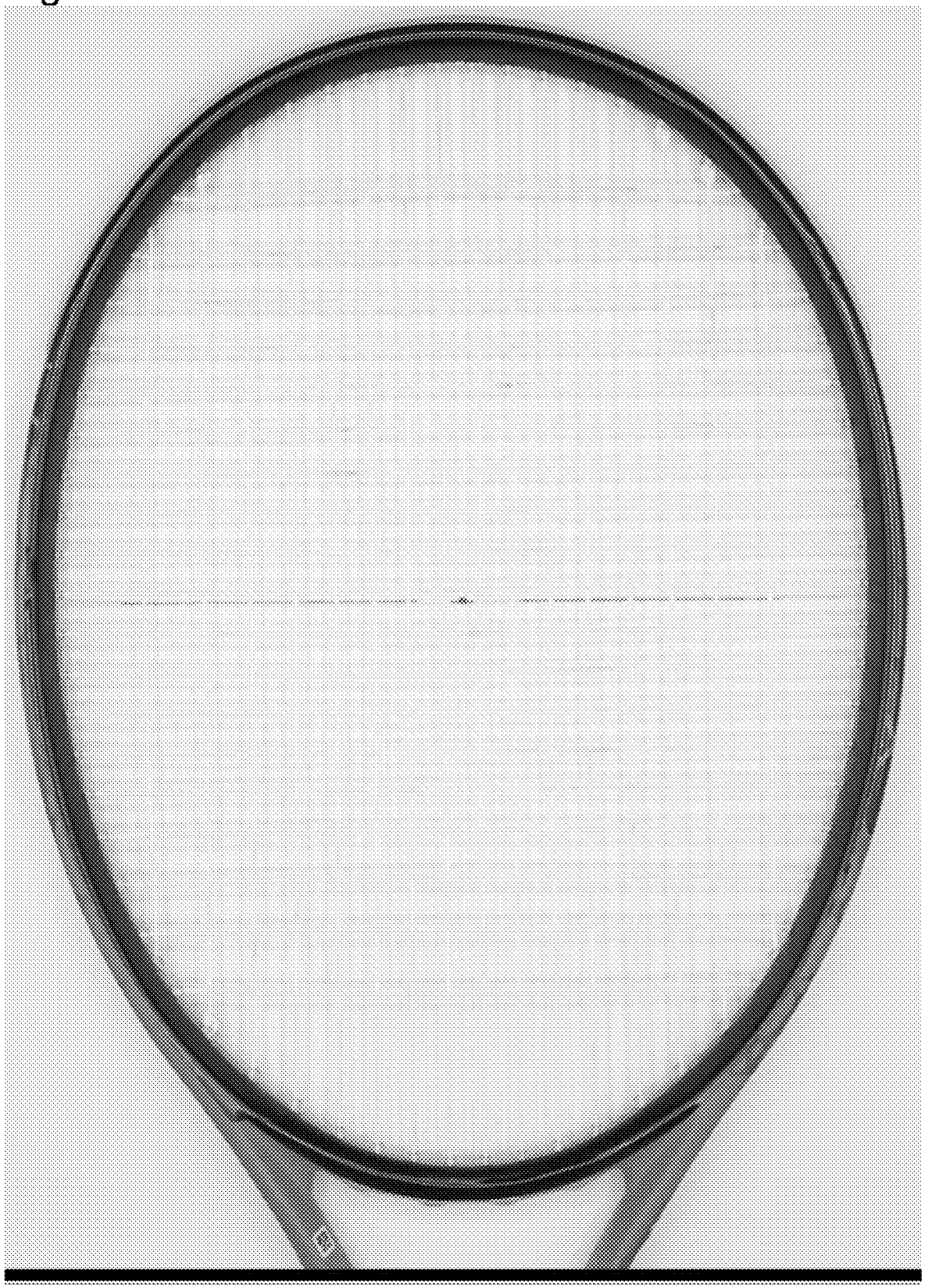
FIG. 4A shows a top view of the tennis racket "Head Graphene Touch Radical MP"
Figure 4B:
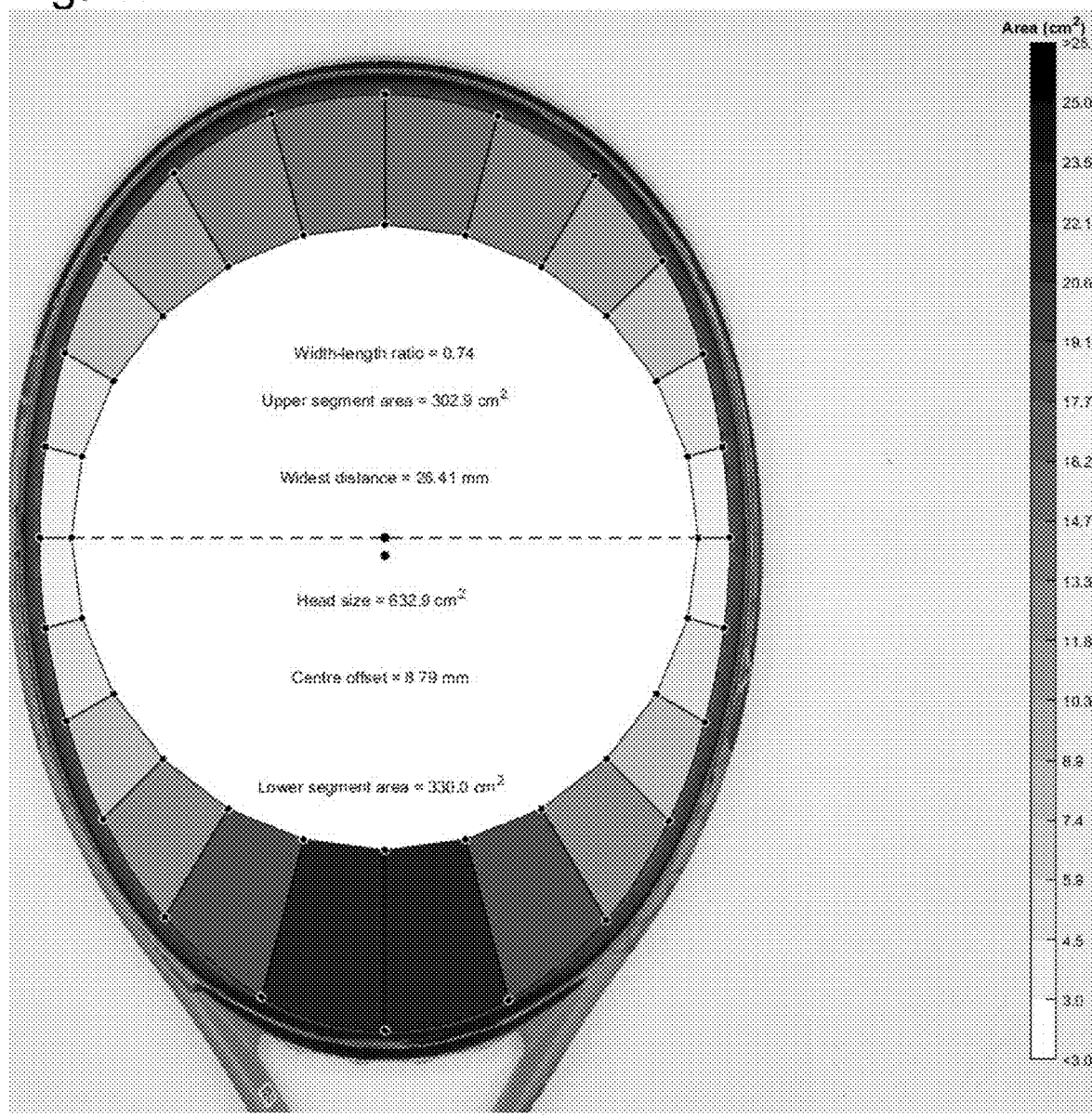
FIG. 4B shows a top view according to FIG. 4A including the racket head contour segments according to the invention.
Figure 5A:
FIG. 5A shows a top view of the tennis racket "Völkl 10 PB"
Figure 5B:
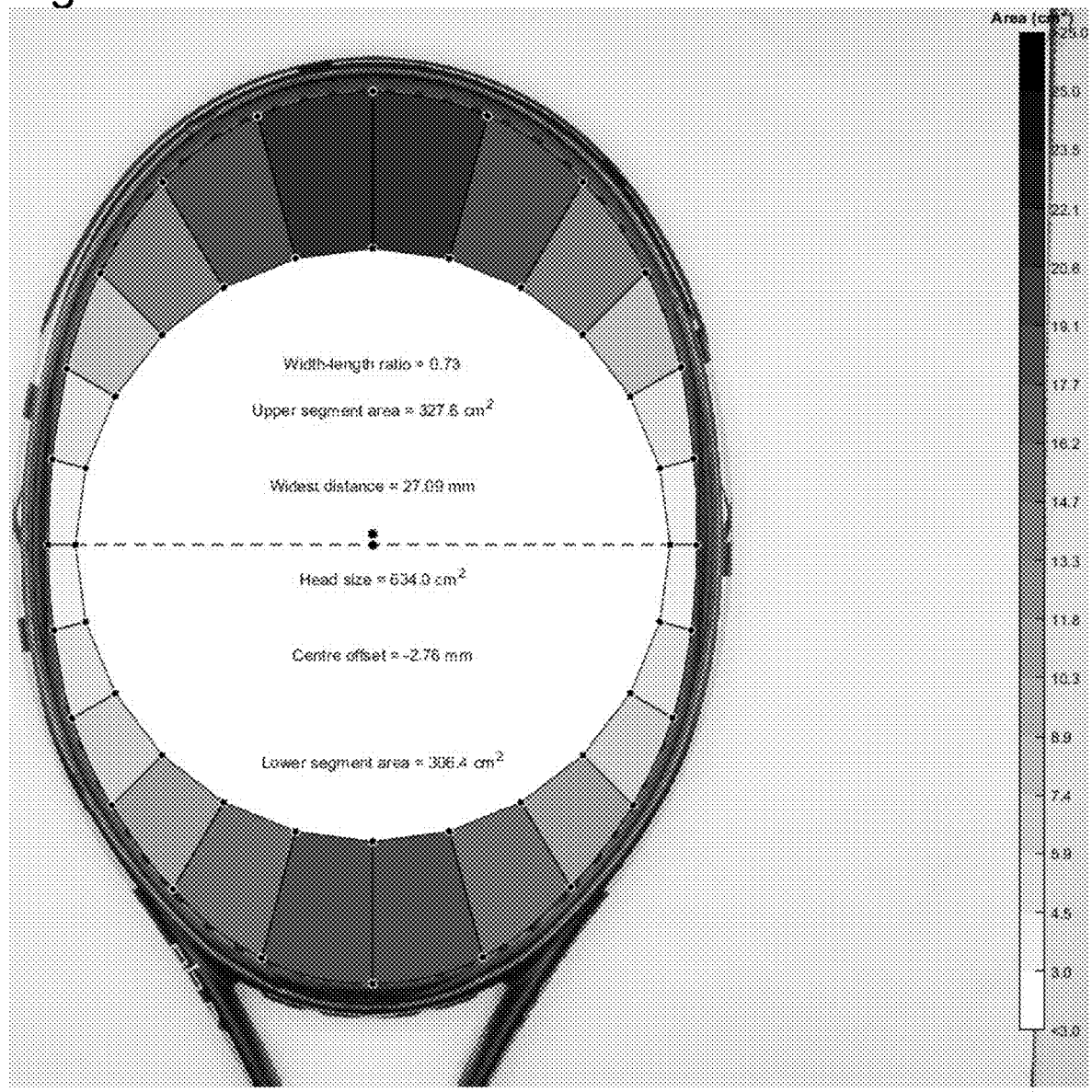
FIG. 5B shows a top view according to FIG. 5A including the racket head contour segments according to the invention.
Figure 6A:
FIG. 6A shows a top view of the tennis racket "Wilson Blade 98 V7"
Figure 6B:
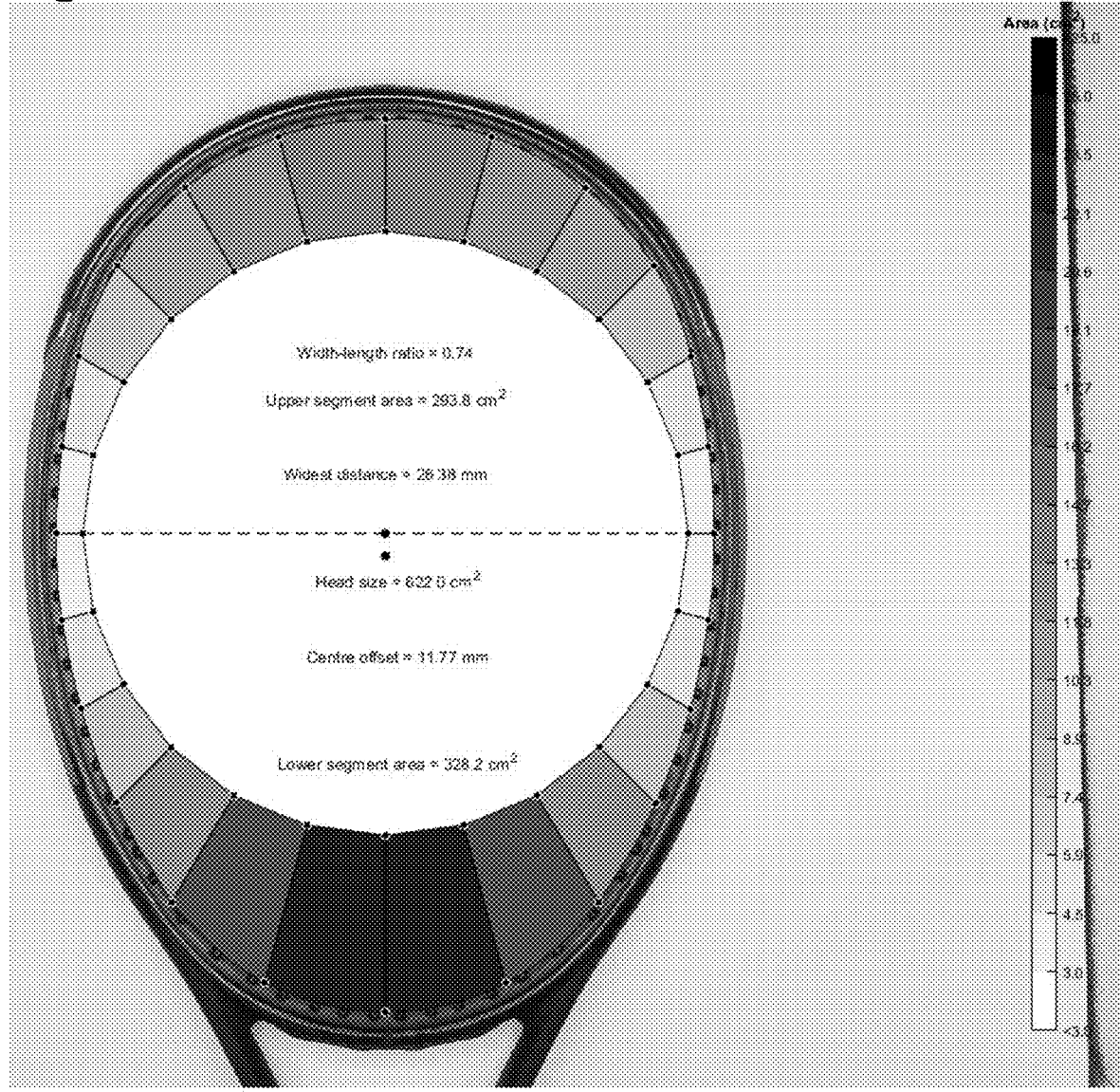
FIG. 6B shows a top view according to FIG. 6A including the racket head contour segments according to the invention.
Figure 7A:
FIG. 7A shows a top view of the tennis racket "Wilson Burn FST 99"
Figure 7B:
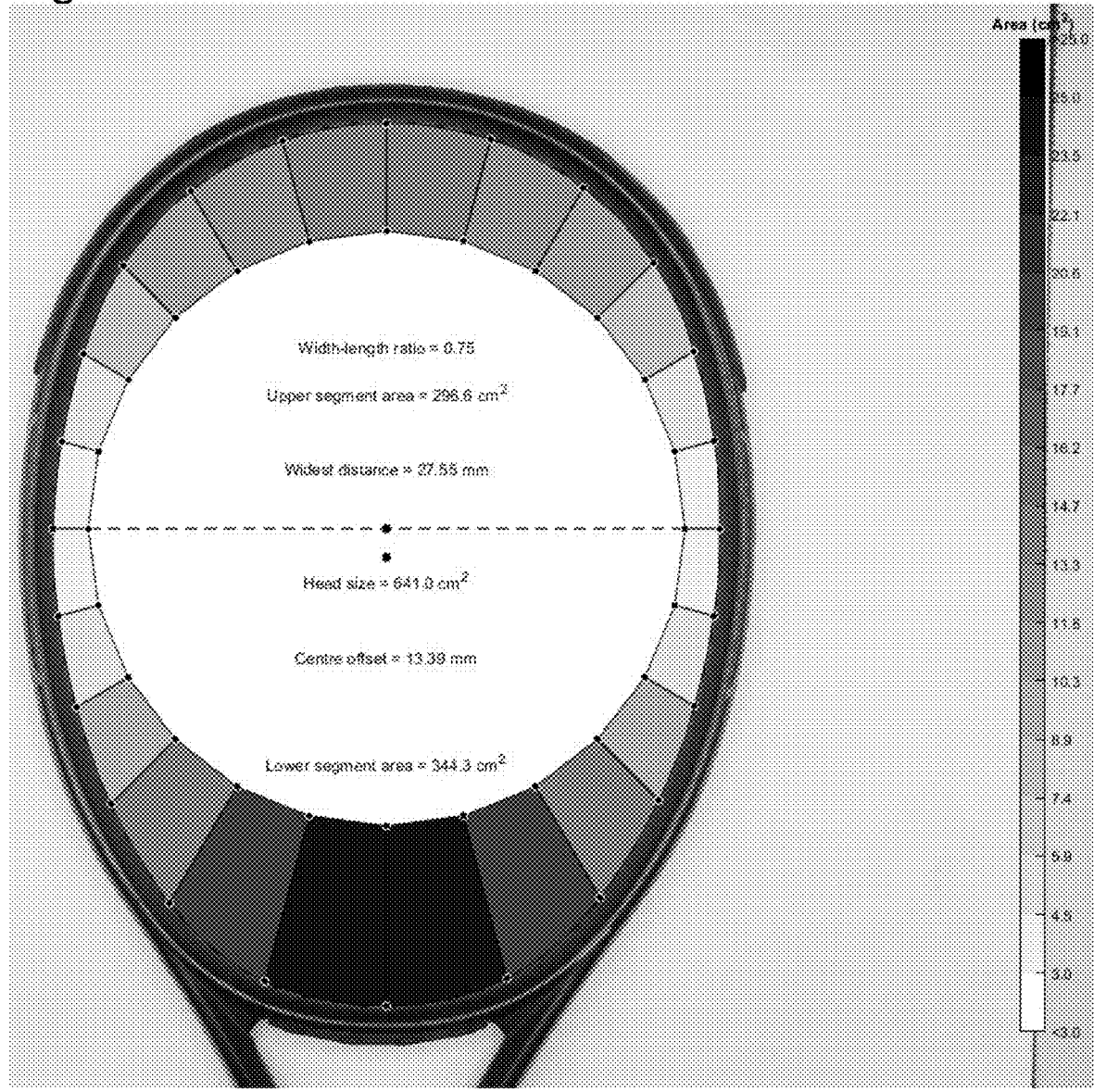
FIG. 7B shows a top view according to FIG. 7A including the racket head contour segments according to the invention.
Figure 8A:
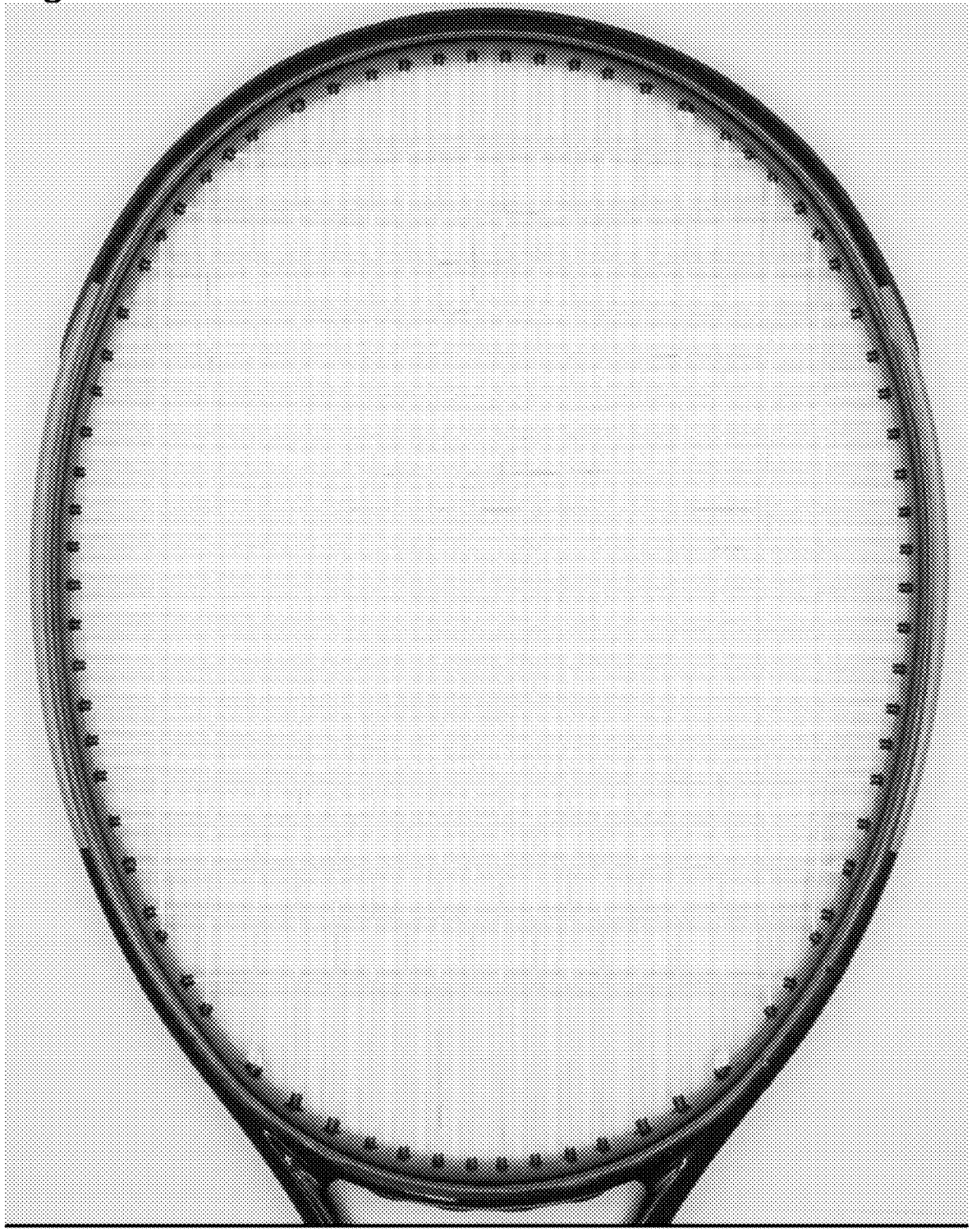
FIG. 8A shows a top view of the tennis racket "Wilson Ultra Tour 97"
Figure 8B:
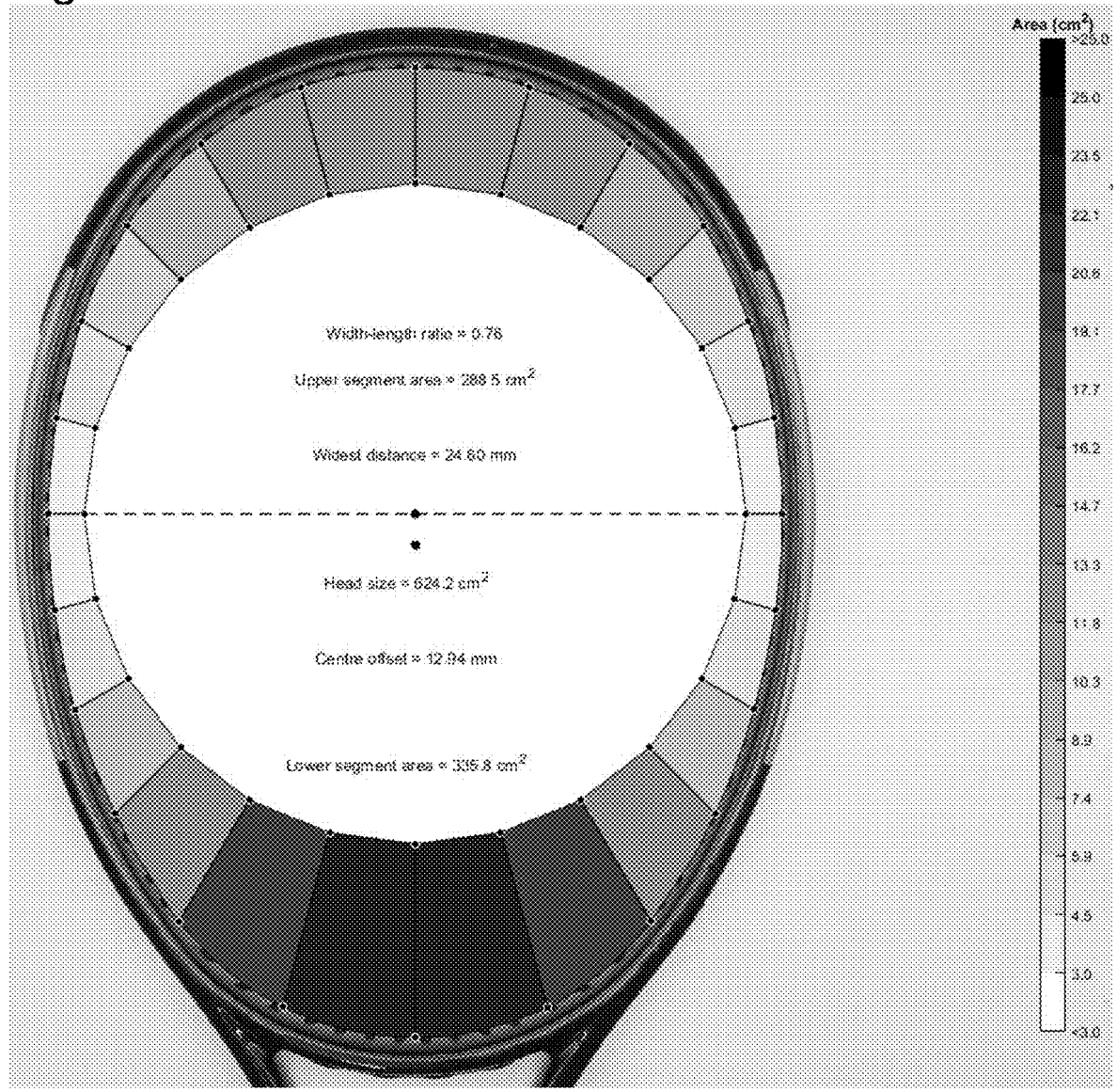
FIG. 8B shows a top view according to FIG. 8A including the racket head contour segments according to the invention.

Thus, for a player who acts a lot from the baseline with strokes that have a high proportion of rotational movement, a racket exhibiting a large center offset, such as the racket in FIG. 3B (HEAD™ Pyramid Tour 630 racket) or the racket in FIG. 7B (Wilson® Burn FST 99 racket), would be particularly suitable. In contrast, for a player who plays a lot of volleys, a racket exhibiting a small or even negative center offset, such as the racket in FIG. 5B (Völkl™ 10 PB racket) or the racket in FIG. 9B (Yonex™ VCore PRO 97 racket), would be particularly suitable.

Figure 9A:
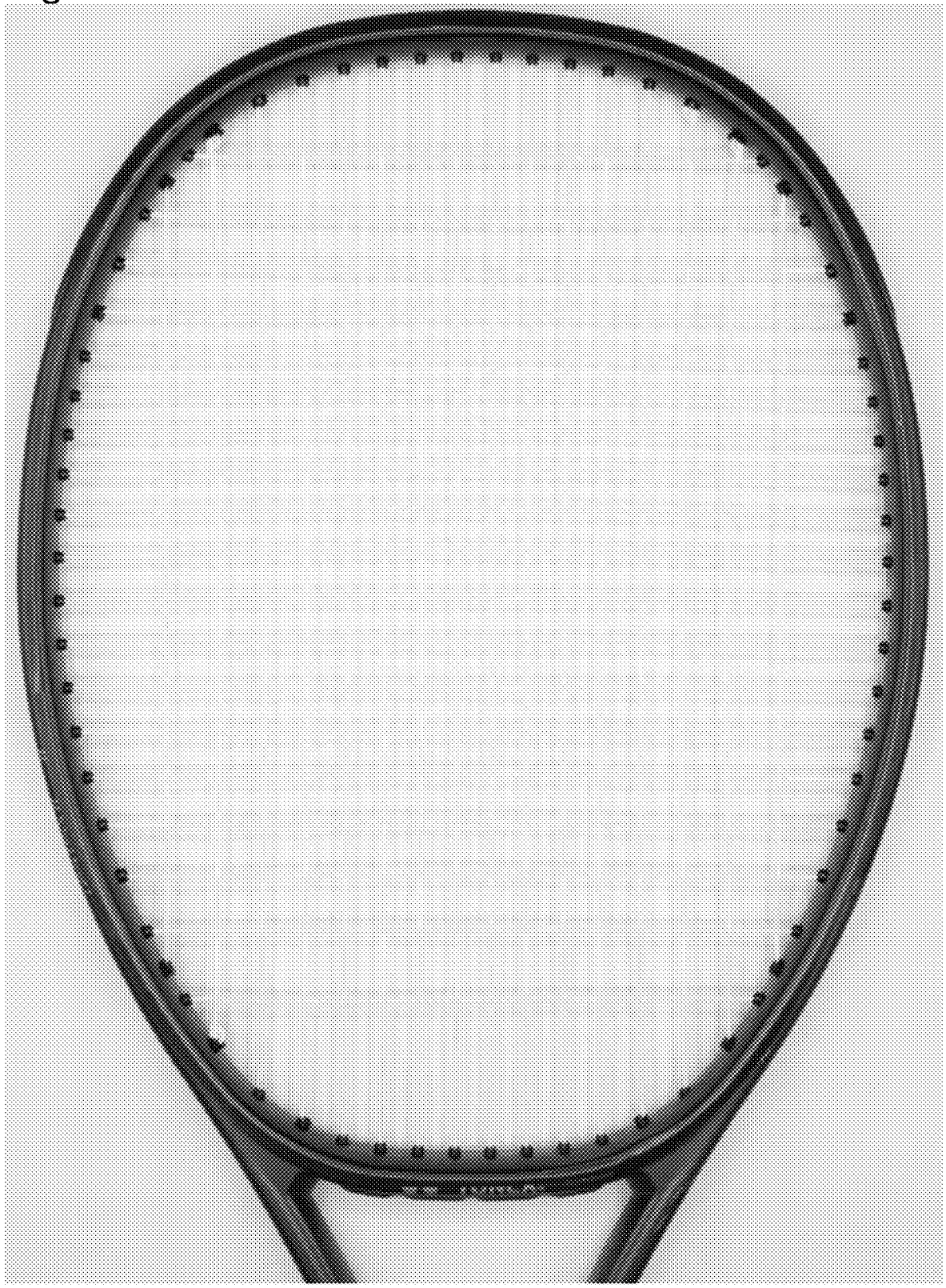
FIG. 9A shows a top view of the tennis racket "Yonex Vcore PRO 97"
Figure 9B:
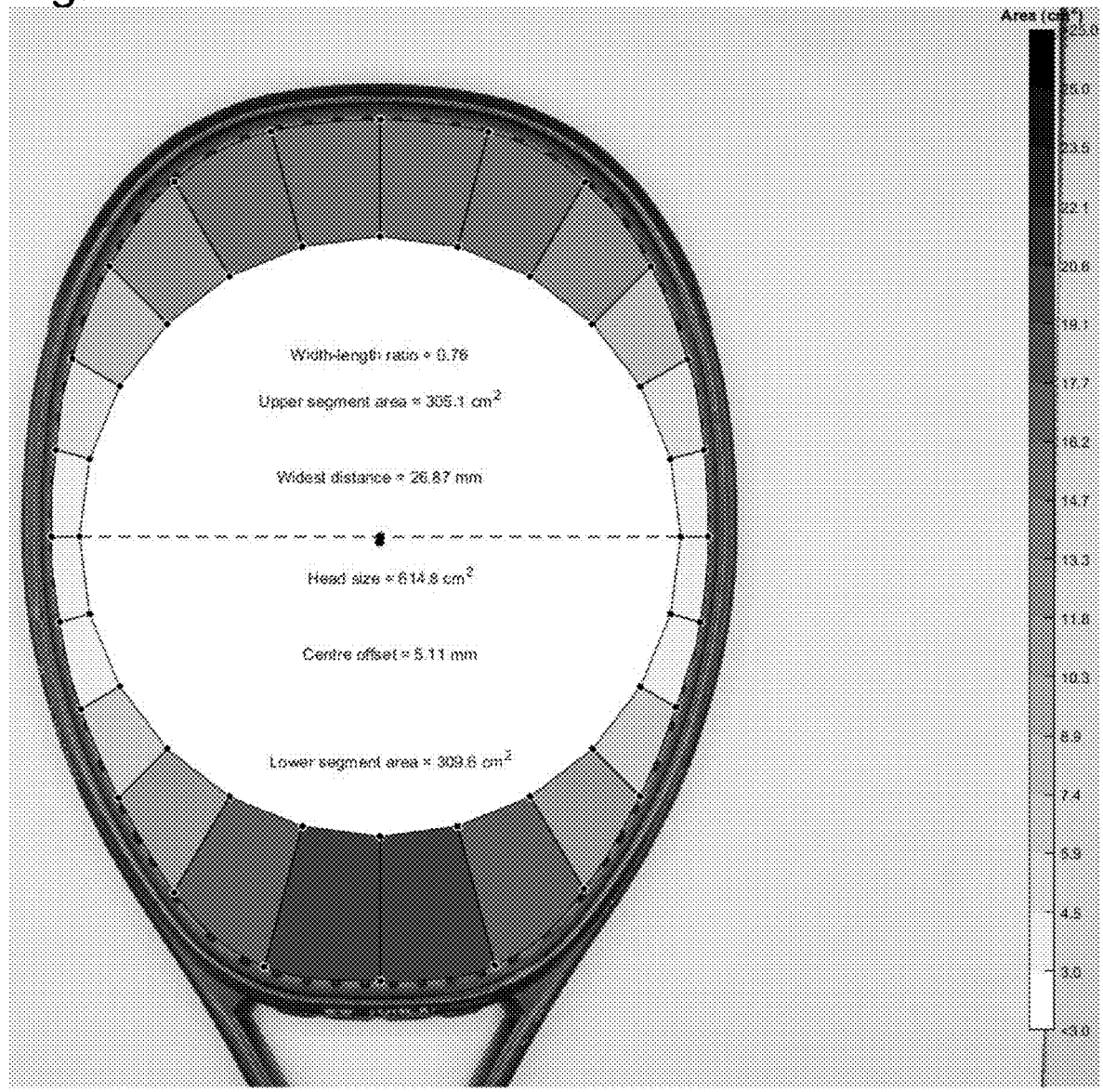
FIG. 9B shows a top view according to FIG. 9A including the racket head contour segments according to the invention.
Figure 10A:
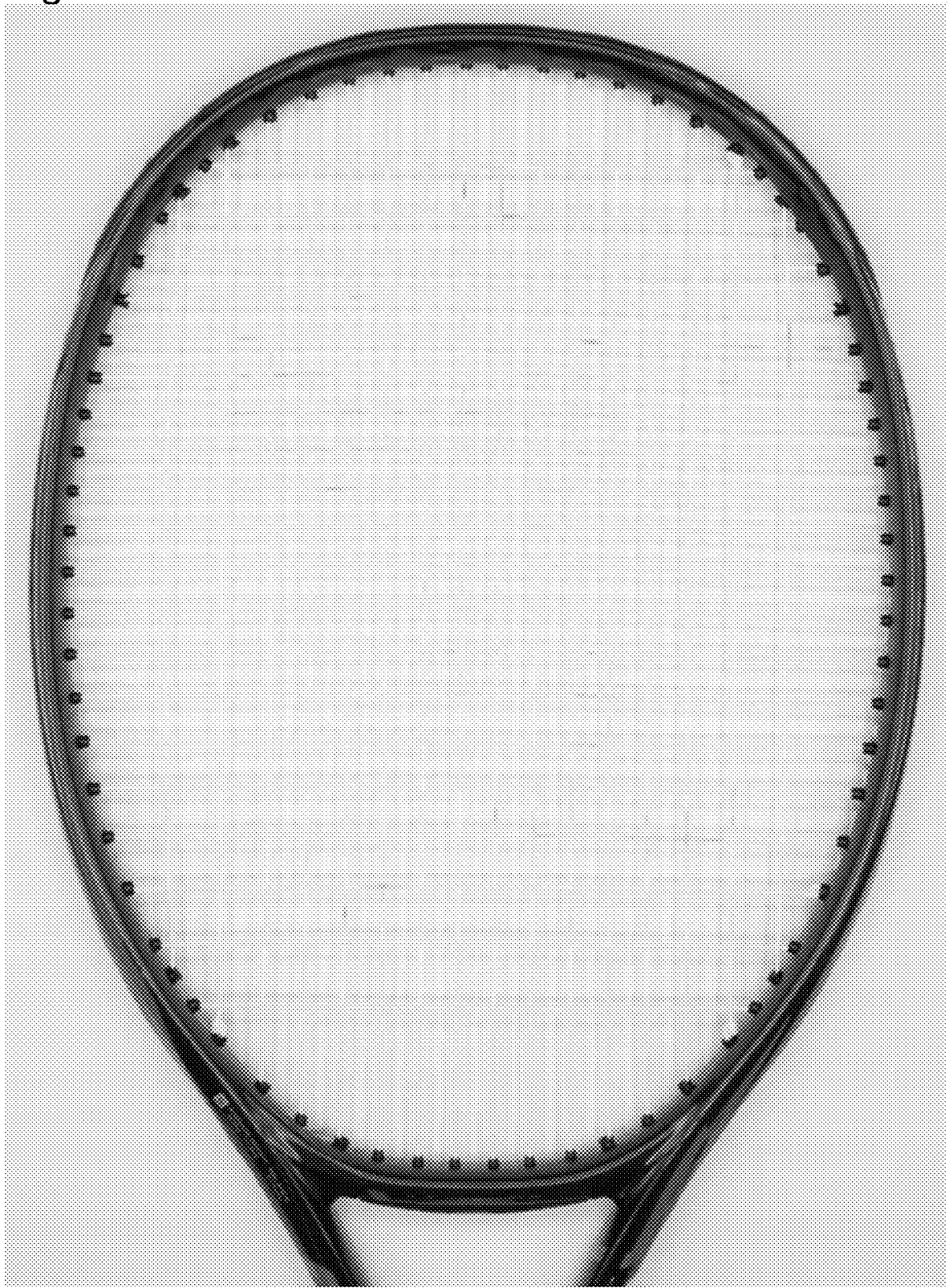
FIG. 10A shows a top view of the tennis racket "Yonex Vcore SV 98"
Figure 10B:
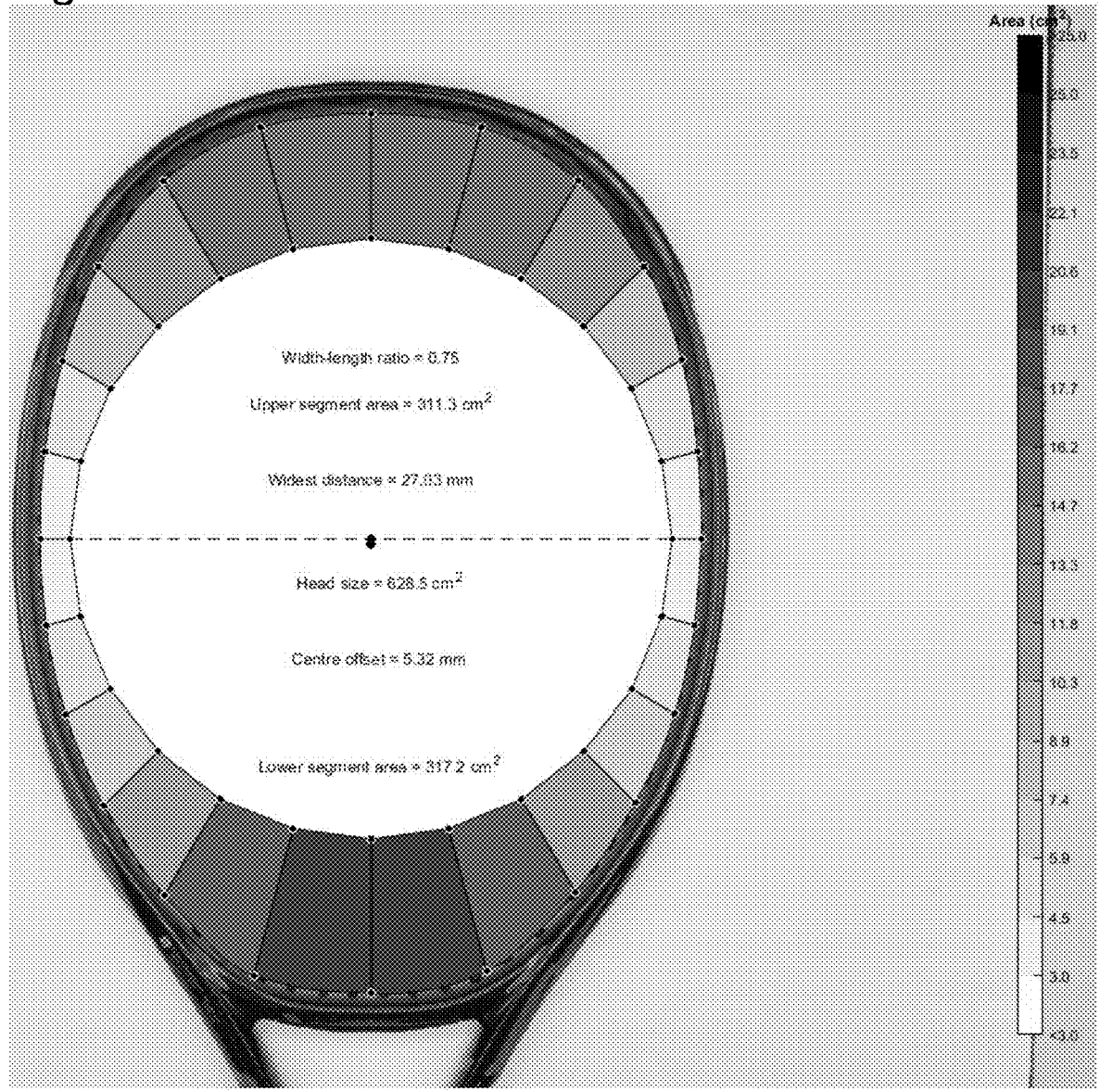
FIG. 10B shows a top view according to FIG. 10A including the racket head contour segments according to the invention.

What is noticeable here is that optically the two rackets in FIG. 3B (HEAD™ Pyramid Tour 630 racket) and FIG. 9B (Yonex™ VCore PRO 97 racket) do show certain similarities. Both would be referred to as teardrop head shape in current usage. However, when determining the respective center offset, these values are extremely different, namely 44.71 mm and 5.32 mm. Visually, by looking at the racket head, this value of the center offset can thus be determined only with great difficulty or insufficiently.

By using the racket head contour segments, the differences can also be seen very clearly when comparing the two head shapes.

Even the basic strokes can be performed in various different ways. For example, some players play rather "smoothly", i.e., without generating a lot of ball spin. This is expressed in a stroke movement in which the racket is swung relatively horizontally through the ball. Since in this case the racket movement is relatively similar to the direction of motion of the incoming ball (only directly opposite), the risk of hits outside the longitudinal axis of the racket is rather low in this case. Therefore, these players typically prefer a racket with a low ratio of width to length. This style of play and the associated rackets were particularly strongly represented in the 1990s, and the racket in FIG. 5B (Völkl™ 10 PB racket) is still a representative of this category.

Meanwhile, most players play their basic strokes with a lot of spin generation by accelerating the racket in contact with the ball not only horizontally but also strongly vertically (mainly by forearm rotation or the wrist as the last link in the kinematic chain). The players practically hit or wipe past the ball at the point of impact and thus achieve a high spin generation. Naturally, when the movement is performed in such a way, i.e. when the direction of movement of the racket in contact with the ball is clearly different from the direction of movement of the incoming ball, there is a greater risk of hitting the ball not on the longitudinal axis of the racket but more to the left or right of the longitudinal axis of the racket (off-center). In the case of extreme forms of these strokes, even professional players can be seen time and again hitting the ball with the racket frame, i.e. the ball is hit on the racket so far to the side that the frame is "in the way". For these types of players, it is thus clearly more important to have a larger width-to-length ratio of the racket head, as is shown, e.g., by the racket in FIG. 9B (Yonex™ VCore PRO 97 racket).

Hence, depending on the movement kinematics with which the player hits, with which tactics he/she plays (a lot of volleys or many basic strokes) and with how much spin he/she plays, very different ideal racket head shapes can result for a plurality of players having the same playing strength, but so far the differences between these racket head shapes can only be insufficiently described with the known methods and data.

Figure 11:
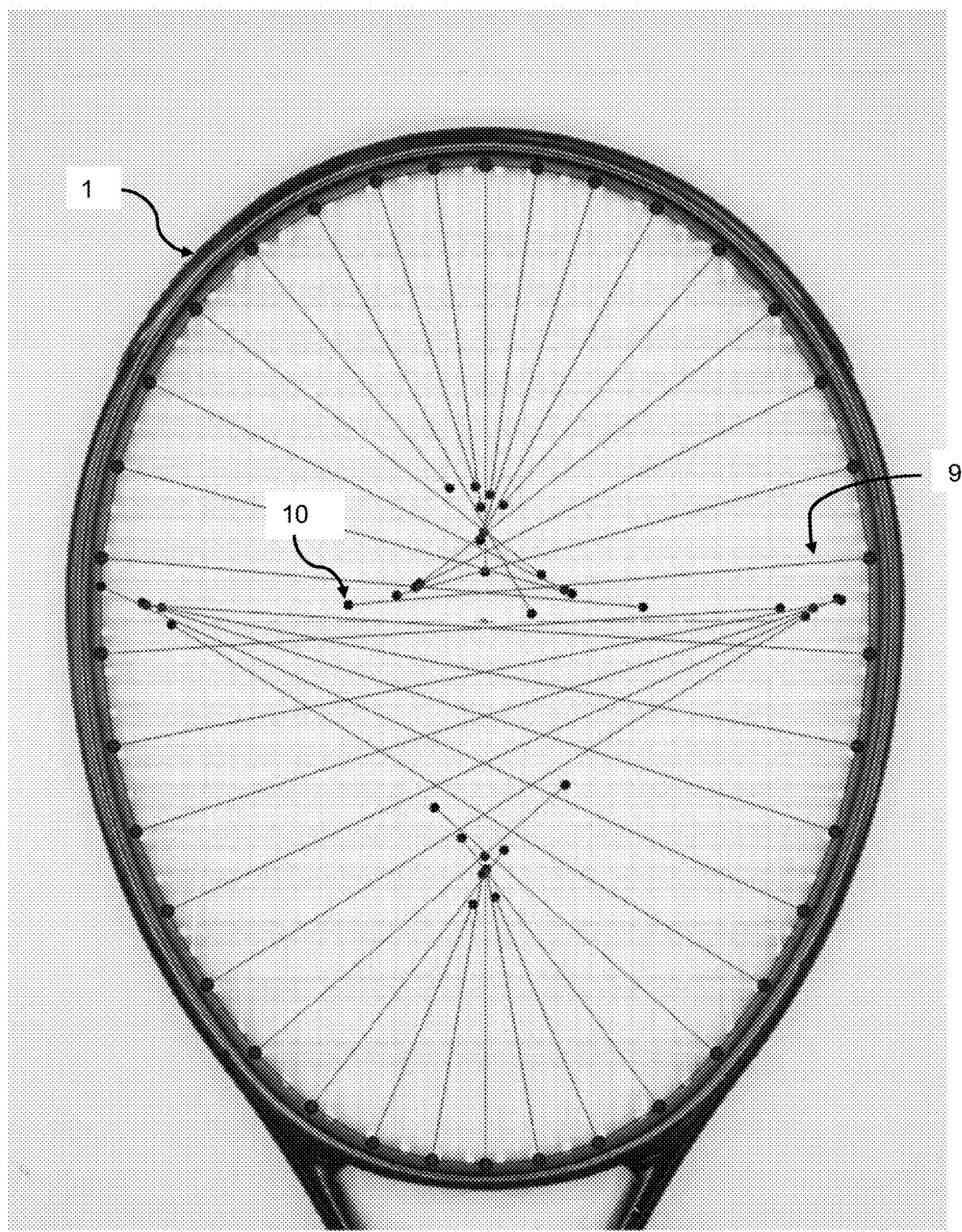
FIG. 11 schematically shows how the evolute according to the invention is established.

Additionally or alternatively, the evolute of the racket head shape can be established according to the invention, as already mentioned. This is schematically illustrated in FIG. 11. Accordingly, the normal vectors 9 to a plurality of points along the racket head contour of the racket head 1 are identified, wherein the end point 10 of each normal vector 9 corresponds to the center of the associated circle of curvature. The plurality of end points of the normal vectors then form the evolute according to the invention, wherein this plurality of end points can optionally also be connected to form a curve.

Figure 12:
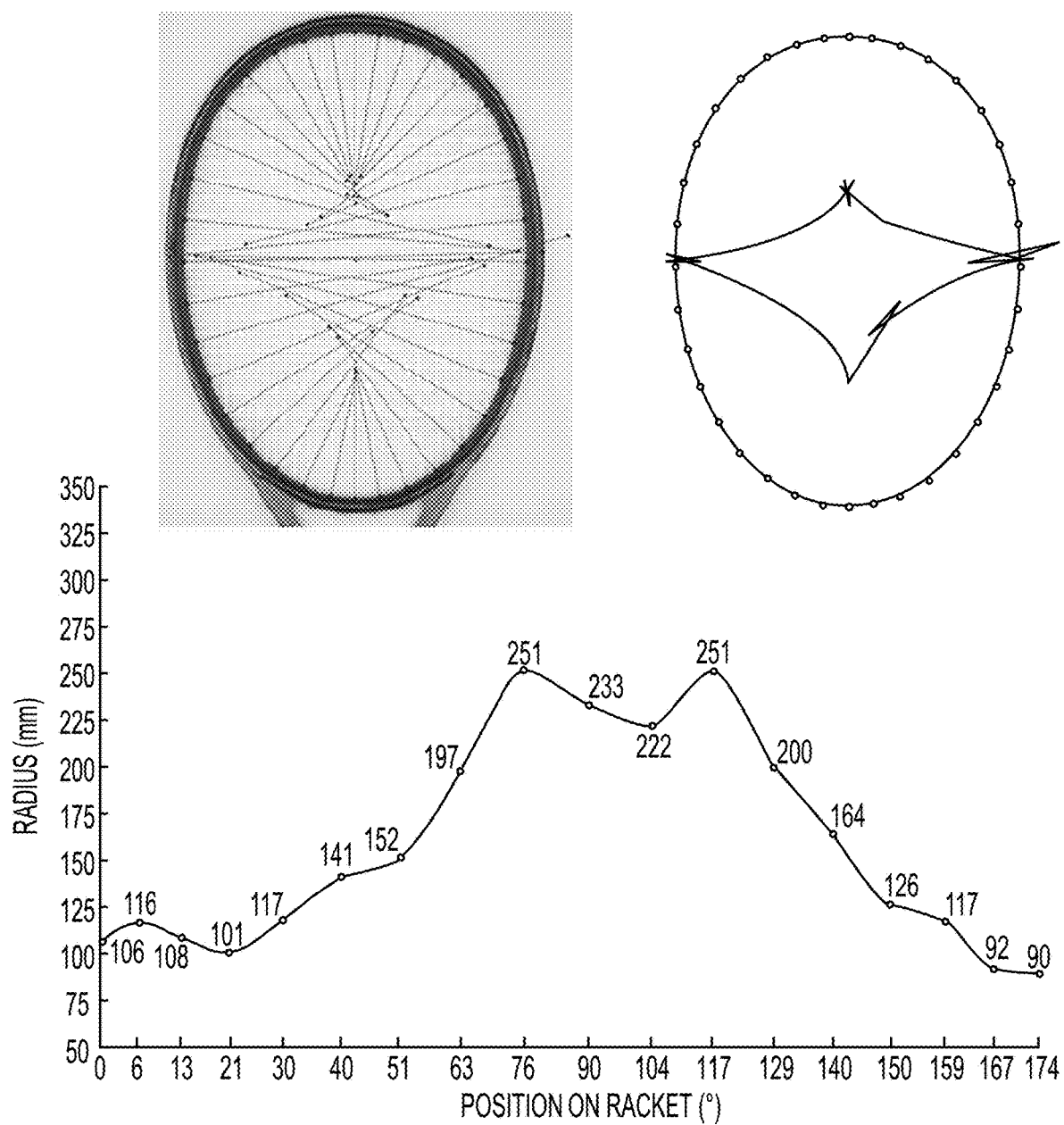
FIG. 12 shows the evolute established according to the invention for the tennis racket "HEAD Graphene Touch Radical MP 2"
Figure 13:
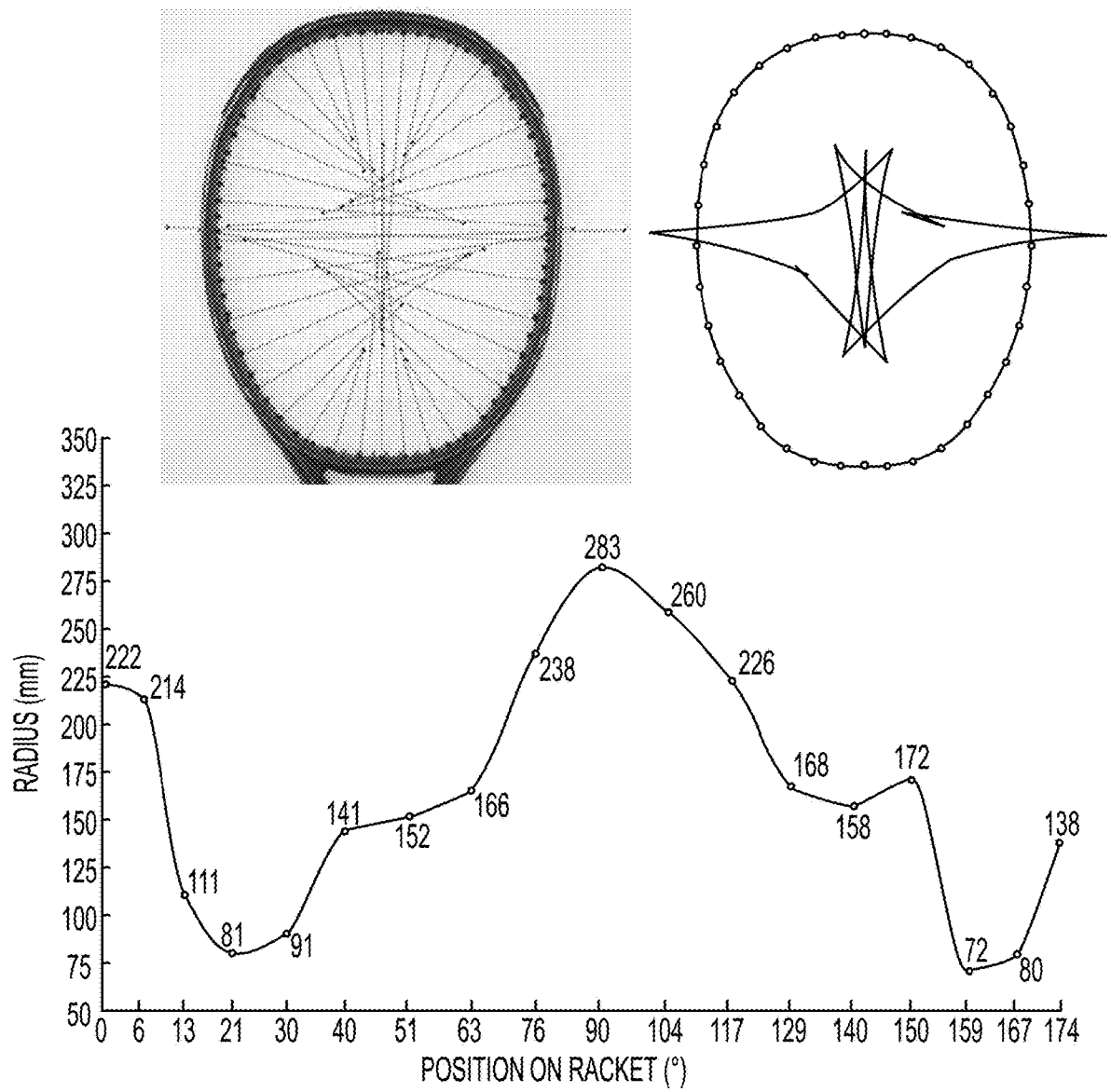
FIG. 13 shows the evolute determined according to the invention for the tennis racket "Yonex Ezone DR100".

In FIGS. 12 and 13, such evolutes are shown together with the racket head contours for the "HEAD™ Graphene Touch Radical MP 2" tennis racket and "Yonex™ Ezone DR100" tennis racket, respectively. Alternatively or additionally to the actual evolute, the length of each normal vector (i.e., the radius of the respective associated circle of curvature) as a function of the corresponding angular position on the racket head contour can also be represented as a curve, as is the case at the bottom of each of FIGS. 12 and 13.

Even though the two racket head contours in FIGS. 12 and 13 reveal to the naked eye that the two rackets have different head shapes, it should be clear that the graphical representations of the evolutes allow far more precise and quantitative conclusions to be drawn.

The invention claimed is:
1. A method for characterizing a racket head (1) of a ball game racket frame comprising the steps of:
 (a) providing data of a ball game racket frame that describe the contour of the racket head of the ball game racket frame;
 (b) automatically determining one or more of the following parameters characterizing the racket head shape on the basis of the contour data: measure of the length-width asymmetry of the racket head, measure of the deviation of the racket head shape from a circular shape, evolute of the racket head contour;
 (c) outputting and/or graphically representing the determined parameter or parameters;
 wherein step (a) comprises:
 (i) creating an image of the racket head of the ball game racket frame with a viewing axis perpendicular to a string bed plane; and
 (ii) automatically determining the contour of the racket head from the image by (1) converting the image of the racket head into a binary pixel image, wherein a threshold value is selected such that a first value is assigned to each of the pixels of the frame and a second value is assigned to each of all other pixels; and (2) identifying the frame pixels and determining the racket head contour;
 wherein in step (b) a measure of the length-width asymmetry of the racket head is determined by:
 (i) identifying the longitudinal diagonal (2) through the racket head contour having the greatest length;
 (ii) identifying the transverse diagonal (3) through the racket head contour having the greatest width;
 (iii) determining the point of intersection (4) of the longitudinal diagonal (2) with the transverse diagonal (3); and
 (iv) determining the offset between the established point of intersection (4) and the midpoint (5) of the longitudinal diagonal (2).

2. A method for characterizing a racket head (1) of a ball game racket frame comprising the steps of:
 (a) providing data of a ball game racket frame that describe the contour of the racket head of the ball game racket frame;
 (b) automatically determining one or more of the following parameters characterizing the racket head shape on the basis of the contour data: measure of the length-width asymmetry of the racket head, measure of the deviation of the racket head shape from a circular shape, evolute of the racket head contour;

(c) outputting and/or graphically representing the determined parameter or parameters;
wherein step (a) comprises:
(i) creating an image of the racket head of the ball game racket frame with a viewing axis perpendicular to a string bed plane; and
(ii) automatically determining the contour of the racket head from the image by (1) converting the image of the racket head into a binary pixel image, wherein a threshold value is selected such that a first value is assigned to each of the pixels of the frame and a second value is assigned to each of all other pixels; and (2) identifying the frame pixels and determining the racket head contour;
wherein in step (b) a measure of the deviation of the racket head shape from a circular shape is determined by:
(i) identifying the longitudinal diagonal (2) through the racket head contour having the greatest length;
(ii) identifying the transverse diagonal (3) through the racket head contour having the greatest width;
(iii) establishing the point of intersection (4) of the longitudinal diagonal (2) with the transverse diagonal (3); and
(iv) defining a circle (6) around the established point of intersection (4) having a diameter smaller than the length of the transverse diagonal (3).

3. The method according to claim 2, wherein the measure of the deviation of the racket head shape from a circular shape is further determined by:
(v) defining a plurality of racket head contour segments (8), each extending from the circle (6) to the racket head contour and bounded by an arc of the circle, a portion of the racket head contour and two sides (7) extending in a radial direction with respect to the point of intersection (4), wherein the angle between the two sides of a racket head contour segment (8) is the same for all racket head contour segments (8); and
(vi) determining the length of the sides (7) of the racket head contour segments (8) and/or the area of the racket head contour segments (8).

4. The method according to claim 2, wherein step (c) comprises graphically representing the racket head contour and the defined circle (6).

5. The method according to claim 3, wherein step (c) comprises graphically representing the racket head contour segments (8).

6. The method according to claim 3, further comprising classifying the racket head contour segments (8) according to the determined length and/or area.

7. The method according to claim 6, further comprising graphically representing a classification by assigning one or more of the following graphical parameters to predetermined classes of the classification: color value, tonal value, hatching.

8. A method for characterizing a racket head (1) of a ball game racket frame comprising the steps of:
(a) providing data of a ball game racket frame that describe the contour of the racket head of the ball game racket frame;
(b) automatically determining one or more of the following parameters characterizing the racket head shape on the basis of the contour data: measure of the length-width asymmetry of the racket head, measure of the deviation of the racket head shape from a circular shape, evolute of the racket head contour;
(c) outputting and/or graphically representing the determined parameter or parameters;
wherein step (a) comprises:
(i) creating an image of the racket head of the ball game racket frame with a viewing axis perpendicular to a string bed plane; and
(ii) automatically determining the contour of the racket head from the image by (1) converting the image of the racket head into a binary pixel image, wherein a threshold value is selected such that a first value is assigned to each of the pixels of the frame and a second value is assigned to each of all other pixels; and (2) identifying the frame pixels and determining the racket head contour;
wherein in step (b) the evolute of the racket head contour is determined by:
(i) identifying the normal vectors (9) to a plurality of points along the racket head contour, wherein the end point (10) of each normal vector (9) corresponds to the center of the associated circle of curvature; and
(ii) connecting the end points (10) to form a curve.

9. The method according to claim 8, wherein step (c) comprises graphically representing the racket head contour and the evolute.

10. The method according to claim 8, wherein the data of the ball game racket frame further comprise CAD data of the contour of the racket head.

11. The method according to claim 1, comprising the additional step of:
(d) determining the playing characteristics of the ball game racket frame by means of the determined parameter or parameters.

12. The method according to claim 1, comprising the additional step of:
(e) determining at least one alternative racket head which approximates the playing characteristics of the characterized racket head with regard to the determined parameter or parameters.

13. The method according to claim 1, comprising the additional steps of:
(f) performing steps (a), (b), and (c) for at least one further ball game racket frame;
(g) comparing the determined parameter or parameters of the ball game racket frame with the determined parameter or parameters of the at least one further ball game racket frame.

14. The method according to claim 1, wherein the data of the ball game racket frame further comprise CAD data of the contour of the racket head.

15. The method according to claim 2, wherein the data of the ball game racket frame further comprise CAD data of the contour of the racket head.

16. The method according to claim 2, comprising the additional steps of:
(f) performing steps (a), (b), and (c) for at least one further ball game racket frame;
(g) comparing the determined parameter or parameters of the ball game racket frame with the determined parameter or parameters of the at least one further ball game racket frame.

17. The method according to claim 2, comprising the additional step of:
(d) determining the playing characteristics of the ball game racket frame by means of the determined parameter or parameters.

18. The method according to claim 2, comprising the additional step of:

(e) determining at least one alternative racket head which approximates the playing characteristics of the characterized racket head with regard to the determined parameter or parameters.

19. The method according to claim 8, comprising the additional steps of:
(f) performing steps (a), (b), and (c) for at least one further ball game racket frame;
(g) comparing the determined parameter or parameters of the ball game racket frame with the determined parameter or parameters of the at least one further ball game racket frame.

20. The method according to claim 8, comprising the additional step of:
(d) determining the playing characteristics of the ball game racket frame by means of the determined parameter or parameters.

\* \* \* \* \*